(12) United States Patent
Hoch

(10) Patent No.: US 9,753,587 B2
(45) Date of Patent: Sep. 5, 2017

(54) DRIVING SENSOR ELECTRODES FOR ABSOLUTE CAPACITIVE SENSING

(71) Applicant: Synaptics Incorporated, San Jose, CA (US)

(72) Inventor: David Hoch, Los Gatos, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 357 days.

(21) Appl. No.: 14/297,373

(22) Filed: Jun. 5, 2014

(65) Prior Publication Data
US 2015/0355746 A1    Dec. 10, 2015

(51) Int. Cl.
G06F 3/044    (2006.01)
G01R 27/26    (2006.01)
G01V 3/08    (2006.01)
G06F 3/041    (2006.01)

(52) U.S. Cl.
CPC ......... *G06F 3/044* (2013.01); *G01R 27/2605* (2013.01); *G01V 3/088* (2013.01); *G06F 3/0416* (2013.01)

(58) Field of Classification Search
CPC .............................. G01R 27/2605; G01F 3/044
See application file for complete search history.

(56) References Cited

U.S. PATENT DOCUMENTS

| 7,649,524 | B2 | 1/2010 | Haim et al. |
| 7,986,313 | B2 | 7/2011 | Krah |
| 8,054,300 | B2 | 11/2011 | Bernstein |
| 8,519,975 | B2 | 8/2013 | Huang et al. |
| 8,970,537 | B1 * | 3/2015 | Shepelev ................ G06F 3/044 178/18.01 |
| 2008/0055260 | A1 | 3/2008 | Posamentier |
| 2009/0273579 | A1 | 11/2009 | Zachut et al. |
| 2010/0149110 | A1 | 6/2010 | Gray |
| 2010/0292945 | A1 | 11/2010 | Reynolds et al. |
| 2011/0007021 | A1 | 1/2011 | Bernstein et al. |

(Continued)

FOREIGN PATENT DOCUMENTS

WO    WO-2013013629 A1    1/2013
WO    WO-2013013633 A1    1/2013
(Continued)

OTHER PUBLICATIONS

PCT/US2015/030867, International Search Report and Written Opinion, dated Aug. 26, 2015, 13 pages.

*Primary Examiner* — Jeff Natalini
(74) *Attorney, Agent, or Firm* — Patterson + Sheridan, LLP

(57) ABSTRACT

In an example, a processing system includes a sensor module having sensor circuitry. The sensor module is configured to drive sensor electrodes with a capacitive sensing signal to acquire first changes of capacitance between each of the sensor electrodes and at least one input object; and drive at least one sensor electrode in a first set of the sensor electrodes with a reference signal and at least one sensor electrode in a second set of the sensor electrodes with a capacitive sensing signal to acquire second changes of capacitance between the at least one sensor electrode in the second set and the at least one input object. The processing system further includes a capacitive measurer module configured to determine a capacitive image based at least in part on the first and second changes of capacitance.

20 Claims, 9 Drawing Sheets

(56) References Cited

U.S. PATENT DOCUMENTS

| | | | |
|---|---|---|---|
| 2011/0025629 A1 | 2/2011 | Grivna et al. | |
| 2011/0102361 A1* | 5/2011 | Philipp | G06F 3/044 345/174 |
| 2011/0216036 A1* | 9/2011 | Zhang | G06F 3/045 345/174 |
| 2012/0044199 A1 | 2/2012 | Karpin et al. | |
| 2012/0050211 A1 | 3/2012 | King et al. | |
| 2012/0113047 A1 | 5/2012 | Hanauer et al. | |
| 2012/0154324 A1 | 6/2012 | Wright et al. | |
| 2012/0262411 A1 | 10/2012 | Ahn et al. | |
| 2012/0299874 A1 | 11/2012 | Chang | |
| 2013/0076643 A1* | 3/2013 | Peterson | G06F 3/0416 345/173 |
| 2013/0100071 A1 | 4/2013 | Wright et al. | |
| 2013/0141382 A1* | 6/2013 | Simmons | G06F 3/044 345/174 |
| 2013/0147732 A1 | 6/2013 | Peterson et al. | |
| 2013/0234980 A1 | 9/2013 | Wang | |
| 2014/0043281 A1 | 2/2014 | Kim et al. | |
| 2014/0049509 A1* | 2/2014 | Shepelev | G06F 3/044 345/174 |
| 2014/0071092 A1* | 3/2014 | Shih | G06F 3/044 345/175 |
| 2015/0035797 A1* | 2/2015 | Shahparnia | G06F 3/041 345/174 |

FOREIGN PATENT DOCUMENTS

| | | |
|---|---|---|
| WO | WO-2013013634 A1 | 1/2013 |
| WO | WO-2013013637 A1 | 1/2013 |

* cited by examiner

DRIVING SENSOR ELECTRODES FOR ABSOLUTE CAPACITIVE SENSING

BACKGROUND OF THE INVENTION

Field of the Invention

Embodiments generally relate to input sensing and, in particular, to input sensing by driving sensor electrodes for absolute capacitive sensing.

Description of the Related Art

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location, and/or motion of one or more input objects. Proximity sensor devices may be used to provide interfaces for the electronic system. For example, proximity sensor devices are often used as input devices for larger computing systems (such as touchpads integrated in, or peripheral to, notebook or desktop computers). Proximity sensor devices are also often used in smaller computing systems (such as touch screens integrated in cellular phones or tablet computers).

Input devices may employ transcapacitance (or "mutual capacitance") to determine a change in capacitive coupling relating to the presence of an input object in a sensing region. Given an array of sensing regions, transcapacitance sensing can be used to generate a capacitive image, from which multiple input objects can be resolved at a given time (e.g., "multi-touch" sensing). However, transcapacitance can produce less reliable results as the distance between the input objects and the sensing regions increases (e.g,. proximity or hover sensing).

SUMMARY OF THE INVENTION

Embodiments generally provide a processing system, input device and method of driving sensor electrodes that employs absolute capacitive sensing to generate a capacitive image. In one embodiment, a processing system includes a sensor module comprising sensor circuitry, the sensor module configured to: drive sensor electrodes with a capacitive sensing signal to acquire first changes of capacitance between each of the sensor electrodes and at least one input object; and drive at least one sensor electrode in a first set of the sensor electrodes with a reference signal and at least one sensor electrode in a second set of the sensor electrodes with a capacitive sensing signal to acquire second changes of capacitance between the at least one sensor electrode in the second set and the at least one input object. The processing system further includes a capacitive measurer module configured to determine a capacitive image based at least in part on the first and second changes of capacitance, In another embodiment, a method of driving sensor electrodes for capacitive sensing includes driving the sensor electrodes with a capacitive sensing signal to acquire first changes of capacitance between each of the sensor electrodes and at least one input object; driving at least one sensor electrode in a first set of the sensor electrodes with a reference signal and at least one sensor electrode in a second set of the sensor electrodes with a capacitive sensing signal to acquire second changes of capacitance between the at least one sensor electrode in the second set and the at least one input object; and determining a capacitive image based at least in part on the first and second changes of capacitance.

In another embodiment, an input device includes sensor electrodes and a processing system coupled to the sensor electrodes. The processing system is configured to: drive the sensor electrodes with a capacitive sensing signal to acquire first changes of capacitance between each of the sensor electrodes and at least one input object; drive at least one sensor electrode in a first set of the sensor electrodes with a reference signal and at least one sensor electrode in a second set of the sensor electrodes with a capacitive sensing signal to acquire second changes of capacitance between the at least one sensor electrode in the second set and the at least one input object; and determine a capacitive image based at least in part on the first and second changes of capacitance.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Various embodiments provide input devices and methods that facilitate improved reliability. In an example, a processing system for an input device includes a sensor module having sensor circuitry. The sensor module is configured to drive sensor electrodes with a capacitive sensing signal to acquire first changes in capacitance between each of the sensor electrodes and an input object. As discussed further herein, changes of capacitance between sensor electrodes and an input object are measures of "absolute capacitance" or "self capacitance", as opposed to measures of "transcapacitance" between individual sensor electrodes. Thus, the first changes in capacitance measured by the sensor module equate to changes in absolute capacitance. The sensor module is further configured to drive at least one sensor electrode in a first set of the sensor electrodes with a reference signal, and at least one sensor electrode in a second set of the sensor electrodes with a capacitive sensing signal, to acquire second changes in capacitance between the sensor electrode(s) and the input object. Again, the second changes in capacitance equate to changes in absolute capacitance. The sensor module is further configured to determine a capacitive image based at least in part on the first and second changes in capacitance.

In some example implementations, the devices described herein can exploit a dualism between transcapacitance and absolute capacitance sensing methodologies to determine a capacitive image using only absolute capacitance sensing. Heretofore, absolute capacitance sensing using two sets of orthogonal sensor electrodes has been used to generate profile information, rather than a capacitive image. Profile sensing is sufficient to detect one input object, but can fail to unambiguously detect multiple input objects (e.g., multi-touch sensing). Capacitive image sensing, in contrast, is capable of resolving multiple input objects unambiguously. Heretofore, capacitive image sensing has been achieved using transcapacitance sensing. Absolute capacitance sensing, however, can detect proximity (e.g., hover sensing) more reliably and at more distance than transcapacitance sensing. Accordingly, example implementations described herein employ absolute capacitance sensing to produce a capacitive image for unambiguously and reliably sensing multiple input objects at proximity to the input device. These and further aspects are described further below.

Figure 1:
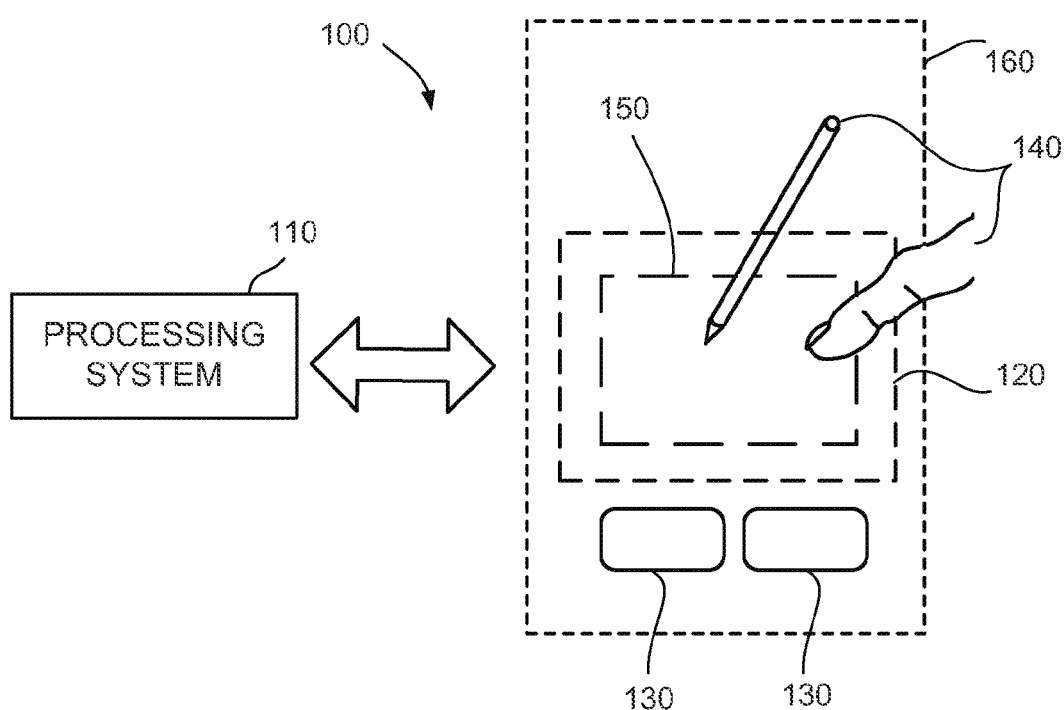
FIG. 1 is a block diagram of a system that includes an input device according to an example implementation.

Turning now to the figures, FIG. 1 is a block diagram of an exemplary input device 100 in accordance with embodiments of the invention. The input device 100 comprises a display device 160 having an integrated sensing device, such as a capacitive sensing device. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice) and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system or can be physically separate from the electronic system. As appropriate, the input device 100 may communicate with parts of the electronic system using any one or more of the following: buses, networks, and other wired or wireless interconnections (including serial and or parallel connections). Examples include I²C, SPI, PS/2, Universal Serial Bus (USB), Bluetooth, RF, and IRDA.

In the embodiment depicted in FIG. 1, the input device 100 is shown as a proximity sensor device (also often referred to as a "touchpad" or a "touch sensor device") configured to sense input provided by one or more input objects 140 in a sensing region 120. Example input objects 140 include fingers and styli, as shown in FIG. 1.

Sensing region 120 overlays the display screen of the display device 160 and encompasses any space above, around, in, and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g., a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100. The face sheet (e.g., an LCD lens) may provide a useful contact surface for an input object.

The input device 100 may utilize any combination of sensor components and sensing technologies to detect user input in the sensing region 120. The input device 100 comprises one or more sensing elements for detecting user input. Some implementations are configured to provide images that span one, two, three, or higher dimensional spaces. Some implementations are configured to provide projections of input along particular axes or planes. Cursors, menus, lists, and items may be displayed as part of a graphical user interface and may be scaled, positioned, selected scrolled, or moved.

In some capacitive implementations of the input device 100, voltage or current is applied to create an electric field. Nearby input objects cause changes in the electric field and produce detectable changes in capacitive coupling that may be detected as changes in voltage, current, or the like.

Some capacitive implementations utilize arrays or other regular or irregular patterns of capacitive sensing elements 150, such as sensor electrodes, to create electric fields. In some capacitive implementations, separate sensing elements 150 may be ohmically shorted together to form larger sensor electrodes. Some capacitive implementations utilize resistive sheets (e.g., may comprise a resistive material such as ITO or the like), which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, changing the measured capacitive coupling. In one implementation, an absolute capacitance sensing method operates by modulating sensor electrodes with respect to a reference voltage (e.g., system ground) and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals and/or to one or more sources of environmental interference (e.g., other electromagnetic signals). Sensor electrodes may be dedicated transmitters or receivers, or sensor electrodes may be configured to both transmit and receive. Alternatively, the receiver electrodes may be modulated relative to ground.

In FIG. 1, a processing system 110 is shown as part of the input device 100. The processing system 110 is configured to operate the hardware of the input device 100 to detect input in the sensing region 120. The sensing region 120 includes an array of sensing elements 150. The processing system 110 comprises parts of, or all of, one or more integrated circuits (ICs) and/or other circuitry components. For example, a processing system for a mutual capacitance sensor device may comprise transmitter circuitry configured to transmit signals with transmitter sensor electrodes and/or receiver circuitry configured to receive signals with receiver sensor electrodes. In some embodiments, the processing system 110 also comprises electronically-readable instructions, such as firmware code, software code, and/or the like, in some embodiments, components of the processing system 110 are located together, such as near sensing element(s) of the input device 100. In other embodiments, components of processing system 110 are physically separate with one or more components close to sensing element(s) of input device 100 and one or more components elsewhere. For example, the input device 100 may be a peripheral coupled to a desktop computer, and the processing system 110 may include software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g., to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions, For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis, Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120 or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 of the sensing device overlaps at least part of an active area of a display screen of the display device 160. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
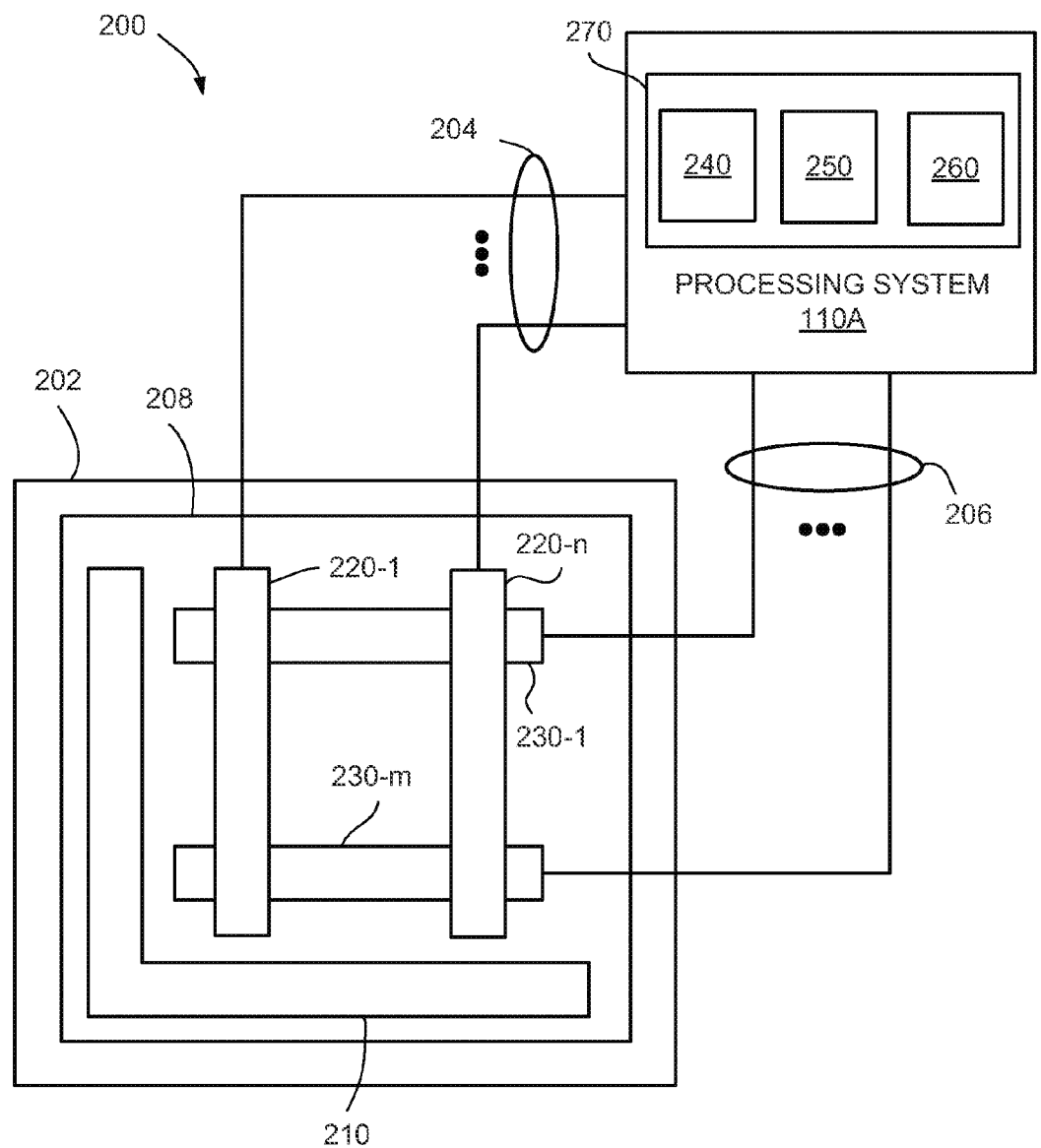
FIG. 2 is a block diagram depicting a capacitive sensor device for an input device according to an example implementation.

FIG. 2 is a block diagram depicting a capacitive sensor device 200 according to an example implementation. The capacitive sensor device 200 includes a sensing device 208 that is disposed on a substrate 202. The sensing device 208 includes sensor electrodes disposed on the substrate 202. The sensor electrodes function as sensing elements of the sensing device 208. In the present example, the sensing device 208 includes two pluralities of sensor electrodes 220-1 through 220-n (collectively "sensor electrodes 220", and 230-1 through 230-m (collectively "sensor electrodes 230"), where m and n are integers greater than zero. The sensing device 208 can also include a plurality of electrodes 210. The sensor electrodes 220 and 230 are separated by a dielectric (not shown). In some examples, the sensor electrodes 220 and the sensor electrodes 230 can be disposed on separate layers of the substrate 202. In other examples, the sensor electrodes 220 and the sensor electrodes 230 can be disposed on a single layer of the substrate 202. The electrodes 210 can be on the same and/or different layers as the sensor electrodes 220 and the sensor electrodes 230. For purposes of clarity by example., the sensor electrodes are shown disposed on a single substrate 202. In some embodiments, the sensor electrodes can be disposed on more than one substrate. For example, some sensor electrodes can be disposed on a first substrate, and other sensor electrodes can be disposed on a second substrate adhered to the first substrate, The sensor electrodes 220 and 230 are coupled to an example implementation of the processing system 110 (referred to as "the processing system 110A") by conductive routing traces 204, 206. As used herein, general reference to the processing system 110 is a reference to the processing system 110 described in FIG. 1 or any other embodiment thereof described herein (e.g., the processing system 110A, 110B, etc.). When in operation, the processing system 110A is coupled to the sensor electrodes 220, 230 through the conductive routing traces 204, 206 to implement a sensing region for sensing inputs. "Sensing region" as used herein encompasses any space above, around, in and/or near the input device in which the sensing device 208 is able to detect user input. For example, the sensing region of an input device can extend from a surface thereof in one or more directions into space until signal-to-noise ratios prevent sufficiently accurate object detection. The distance to which the sensing region extends in a particular direction may be on the order of less than a millimeter, millimeters, centimeters, or more, and may vary significantly with the type of sensing technology used and the accuracy desired. For purposes of clarity by example, the sensing device 208 is shown with the sensor electrodes 220, 230 arranged in an x/y grid. It is to be understood that the sensing device 208 is not limited to such an x/y arrangement, but instead can include numerous sensor patterns. Although the sensing device 208 is depicted as rectangular, the sensing device 208 can have other shapes, such as a circular shape.

The electrodes 210 can be coupled to receive a reference voltage, such as system ground or other substantially constant voltage. In that respect, the electrodes 210 may be referred to as "ground traces." "System ground" may indicate a common voltage shared by system components. For example, a capacitive sensing system of a mobile phone can, at times, be referenced to a system ground provided by the phone's power source (e.g., a charger or battery). In many systems, the system ground is connected to or provide by the largest area electrode in the system. The capacitive sensor device 200 can be located proximate to such a system ground electrode (e.g., located above a ground plane or backplane). In addition to the system ground electrode, the capacitive sensor device 200 can include the electrodes 210, which can be disposed at least partially around the sensor electrodes 220, 230.

The capacitive sensor device 200 can be utilized to communicate user input (e.g., a user's finger, a probe such as a stylus, and /or some other external input object) to an electronic system (e.g., computing device or other electronic device). For example, the capacitive sensor device 200 can be implemented as a capacitive touch screen device that can be placed over an underlying image or information display device (not shown). In this manner, a user would view the underlying image or information display by looking through substantially transparent elements in the sensing device 208. When implemented in a touch screen, the substrate 202 can include at least one substantially transparent layer (not shown). The sensor electrodes 220, 230 and the conductive routing traces 204, 206 can be formed of substantially transparent conductive material. Indium tin oxide (ITO) and/or thin, barely visible wires are but two of many possible examples of substantially transparent material that can be used to form the sensor electrodes 220, 230 and/or the conductive routing traces 204, 206. In other examples, the conductive routing traces 204, 206 can be formed of non-transparent material, and then hidden in a border region (not shown) of the sensing device 208.

In another example, the capacitive sensor device 200 can be if implemented as a capacitive touchpad, slider, button, or other capacitance sensor. For example, the substrate 202 can be implemented with, but not limited to, one or more dear or opaque materials. Likewise, dear or opaque conductive materials can be utilized to form sensor electrodes and/or conductive routing traces for the sensing device 208.

In general, the processing system 110A drives sensor electrode(s) of the sensing device 208 with a capacitive sensing signal to obtain indicia of capacitance. The term "drive" as used herein encompasses controlling some electrical aspect of the driven dement. For example, it is possible to drive current through a wire, drive charge into a conductor, drive a substantially constant or varying voltage waveform onto an electrode, etc. In an example, the processing system 110A drives sensor electrode(s) of the sensing device 208 with a voltage and senses resulting respective charge on sensor electrode(s). The processing system 110 obtains measurement(s) of capacitance from the sensed charge. In another example, the processing system 110A drives sensor electrode(s) of the sensing device 208 with charge and senses resulting respective voltage on sensor electrode(s). The processing system 110A obtains measurement(s) of capacitance from the sensed voltage. In general, the term "capacitive sensing signal" is meant to encompass both driving voltage to sense charge and driving charge to sense voltage, as well as any other type of signal that can be used to obtain indicia of capacitance. "Indicia of capacitance" include measurements of charge, voltage, and the like, as well as measurements of a change in charge, voltage, and the like with respect to a baseline.

The processing system 110A can include a sensor module 240, a capacitive measurer module 250, and a position determiner module 260. The sensor module 240, the capacitive measurer module 250, and the position determiner module 260 comprise modules that perform different functions of the processing system 110A. In other examples, different configurations of modules can perform the functions described herein. The sensor module 240, the capacitive measurer module 250, and the position determiner module 260 can include sensor circuitry 270 and can also include firmware, software, or a combination thereof operating in cooperation with the sensor circuitry 270.

The sensor module 240 selectively drives signal(s) on one or more sensor electrodes of the sensing device 208. The sensor module 240 can also selectively sense indicia of capacitance from one or more sensor electrodes of the sensing device 208. For example, the sensor module 240 can selectively drive sensor electrodes of the sensing device 208 with a capacitive sensing signal, and sense resulting indicia of capacitance. In such a scheme, the resulting indicia of capacitance include measurements of absolute capacitance. The sensor module 240 can drive sensor electrodes of the sensing device 208 with other signals, including guard and reference signals, as discussed below, when sensing indicia of capacitance. By driving specific ones of the sensor electrodes of the sensing device 208 with specific signals, the sensor module 240 can implement a sensing region from which indicia of capacitance can be obtained.

In some examples, the sensor module 240 can also selectively receive signal(s) on one or more sensor electrodes of the sensing device 208. For example, the sensor module 240 can drive signals on some electrodes and receive those signals on other electrodes to obtain indicia of capacitance. In such a scheme, the resulting indicia of capacitance include measurements of transcapacitance.

The capacitive measurer module 250 performs capacitance measurements based indicia of capacitance obtained by the sensor module 240. The capacitance measurements can include changes in capacitive couplings between elements (also referred to as "changes in capacitance"). For example, the capacitive measurer module 250 can determine baseline measurements of capacitive couplings between elements without the presence of external input object(s). The capacitive measurer module 250 can then combine the baseline measurements of capacitive couplings with measurements of capacitive couplings in the presence of external input object(s) to determine changes in capacitive couplings. In another example, the indicia of capacitance from the sensor module 240 already account for the baseline, and thus the capacitive measurer module 250 can determine changes in capacitance directly from the indicia of capacitance.

In an example, the capacitive measurer module 250 can perform a plurality of capacitance measurements associated with specific portions of the sensing region as "pixels" to create a "capacitive image." A pixel of a capacitive image can be referred to as a location within the sensing region of the sensing device 208 in which a capacitive coupling can be measured using sensor electrode(s) of the sensing device 208. For example, a pixel can correspond to an intersection of sensor electrodes. The capacitive measurer module 250 can determine an array of capacitive coupling changes using the sensor electrodes 220, 230 to produce an x/y array of pixels that form a capacitive image. In this manner, the processing system 110 can capture a capacitive image that is a snapshot of the response measured in relation to an input object or objects in the sensing region of the sensing device 208. A given capacitive image can include all of the pixels in the sensing region, or only a subset of the pixels.

The sensor module 240 and the capacitive measurer module 250 can cooperate to obtain measurements of either absolute capacitance, transcapacitance, or a combination thereof. In an example, discussed further below, the sensor module 240 and the capacitive measurer module 250 cooperate to obtain a capacitive image using only measurements of absolute capacitance. It is to be understood that the processing system 110A can be configured to operate in at least one mode, including a first mode where only absolute capacitance sensing is employed, and optionally a second mode with transcapacitance sensing or a combination of absolute and transcapacitance sensing is employed.

Measurement(s) of capacitance by the processing system 110A, such as capacitive image(s), enable the sensing of contact, hovering, or other user input with respect to the formed sensing regions by the sensing device 208. The position determiner module 260 can utilize the measurement(s) of capacitance to determine positional information with respect to a user input relative to the sensing regions formed by the sensing device 208. The position determiner module 260 can additionally or alternatively use such measurement(s) to determine input object size and/or input object type.

Figure 3:
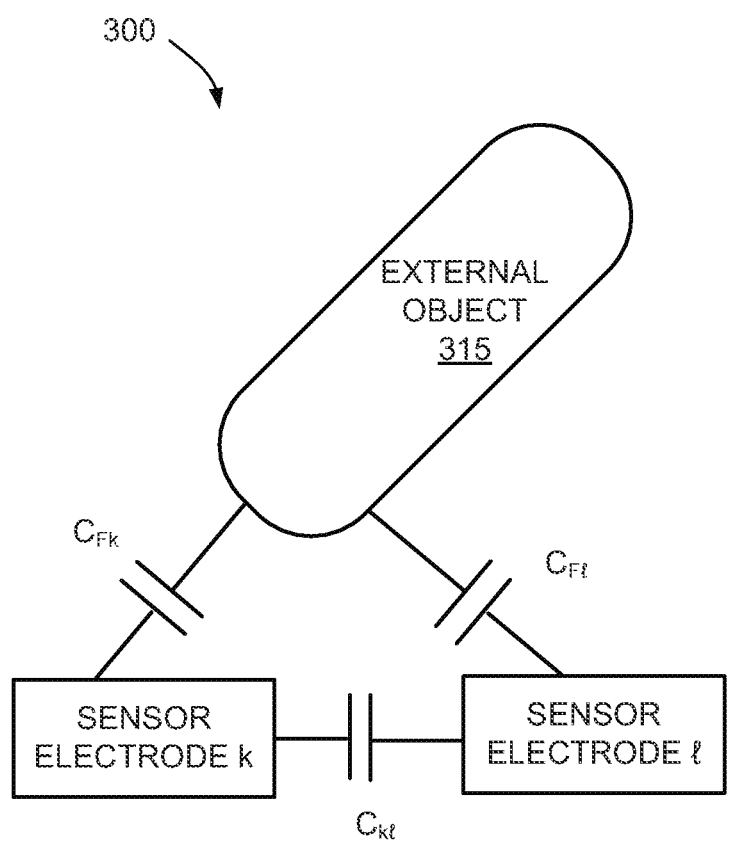
FIG. 3 shows a simplified model of a sensor with two sensor electrodes and one external object according to an example implementation.

FIG. 3 shows a simplified model 300 of a sensor with two sensor electrodes and one external object according to an example implementation. The model 300 includes an external object 315 and sensor electrodes designed "k" and "l". In general, the sensor electrodes k and l are selected from the universe of electrodes on the sensing device 208 (e.g., the sensor electrodes 220, 230, as well as electrodes 210). In specific operational modes, the sensor electrodes k and l are selected from subsets of the electrodes on the sensing device 208. For purposes of clarity by example, the model 300 has been simplified. In practical applications, there may be additional external objects (that may or may not be intended as input objects), other sensor electrodes, noise, etc. In the model 300, $C_{Fk}$ shows the capacitive coupling between sensor electrode k and the external object 315; $C_{Fl}$ shows the capacitive coupling between the sensor electrode l and the external object 315; and $C_{kl}$ shows the capacitive coupling between sensor electrodes k and l.

The processing system 110 can drive the sensor electrodes k and l (along with other sensor electrode(s) not shown) with signals to determine changes in capacitive coupling in the presence of the external object 315. Consider a general operational mode where the processing system 110 drives the sensor electrode k with a voltage $V_k$ and the sensor electrode l with a voltage $V_l$. The induced charge difference (with respect to baseline) at the sensor electrode k can be described by:

$$\Delta Q_k = \sum_{\ell \in E \setminus \{k\}} (V_\ell - V_k)(\Delta C_t(\ell, k) - C_{LGM}(\ell, k)), \quad \text{Eq. 1}$$

where E is the set of electrodes, $\Delta C_t(l,k)$ is the transcapacitance between sensor electrodes k and l, and $C_{LGM}(l,k)$ is the parasitic transcapacitance due to a low ground mass (LGM) condition. When the grounding condition of the input device or electronic system is low or otherwise non-optimal (e.g., when the input device is lying on a desk, rather than being held by a user), the device/system is said to be in an LGM condition. The LGM term can vary depending on the grounding condition of the input device or electronic system.

To gain better insight for determining a capacitive image using absolute capacitance measurements, the electrodes can be divided into three groups: K denotes the set of sensor electrodes driven at a potential $V_K$, B is the subset of electrodes that coupled to a reference potential $V_B$, and P is a subset of sensor electrodes driven at a potential $V_P$. Thus, the set E of electrodes is the union of sets K B, and P.

In a first mode (referred to as the "α-mode"), the subset P is excited with the same potential as the subset K. That is, all sensor electrodes in subsets P and K are driven with the same potential such that $V_P = V_K$. Only the subset B of electrodes are coupled to a reference potential $V_B$ (e.g., the background plane and/or other ground traces). The α-mode is also referred to as the "guarded absolute capacitance" mode. In the α-mode, a set of induced charge differences, designated $\Delta Q\_k\hat{}(\alpha(\alpha))$, can be obtained for a plurality of sensor electrodes. The indicia of capacitance obtained in the α-mode, e.g., induced charge differences $\Delta Q\_k\hat{}(\alpha(\alpha))$, may be referred to as "α-measurements."

In a second mode (referred to as the "β-mode"), the subset P is driven with a reference potential, e.g., $V_P = V_B$. The subset K is driven with the potential $V_K$. The subset P represents special selected electrodes, which can be selected based on the α-measurements as discussed further below. In the β-mode, a set of induced charge differences, designated $\Delta Q\_k\hat{}(\alpha(\beta))$, can be obtained for a plurality of sensor electrodes. The indicia of capacitance obtained in the β-mode, e.g., induced charge differences $\Delta Q\_k\hat{}(\alpha(\beta))$, may be referred to as "β-measurements."

Subtracting the β-measurement from the α-measurement leads to the following:

$$\Delta Q_k^{a(\alpha)} - \Delta Q_k^{a(\beta)} = (V_K - V_B)\left[\sum_{\ell \in P} \Delta C_t(k, \ell) - \sum_{\ell \in P} C_{LGM}(\ell, k)\right]. \quad \text{Eq. 2}$$

The right-hand side of Equation 2 corresponds to the transcapacitance measurement $\Delta Q\_k\hat{}t(k, P)$ when the P sensor electrodes are driven at potential $V_K$ and the charge is measured at the sensor electrode k at potential $V_B$. The superscript "t" denotes a measurement of transcapacitance. A capacitive image is given by:

$$\Delta Q_k^t(k, \ell), k=1, \ldots, N_{rx}, \ell=1, \ldots, N_{tx} \quad \text{Eq. 3}$$

where $N_{rx}$ is the number of receiver sensor electrodes, and $N_{tx}$ is the number of transmitter sensor electrodes, in the transcapacitance scheme. Since a series of transcapacitance measurements yield a capacitive image, then from the left-hand side of Equation 2, a series of differences of β-measurements from an α-measurement yields the same capacitive image. Thus, the processing system 110 can produce a capacitive image using only absolute capacitance measurements through operation of α- and β-modes, as described below.

Figure 4:
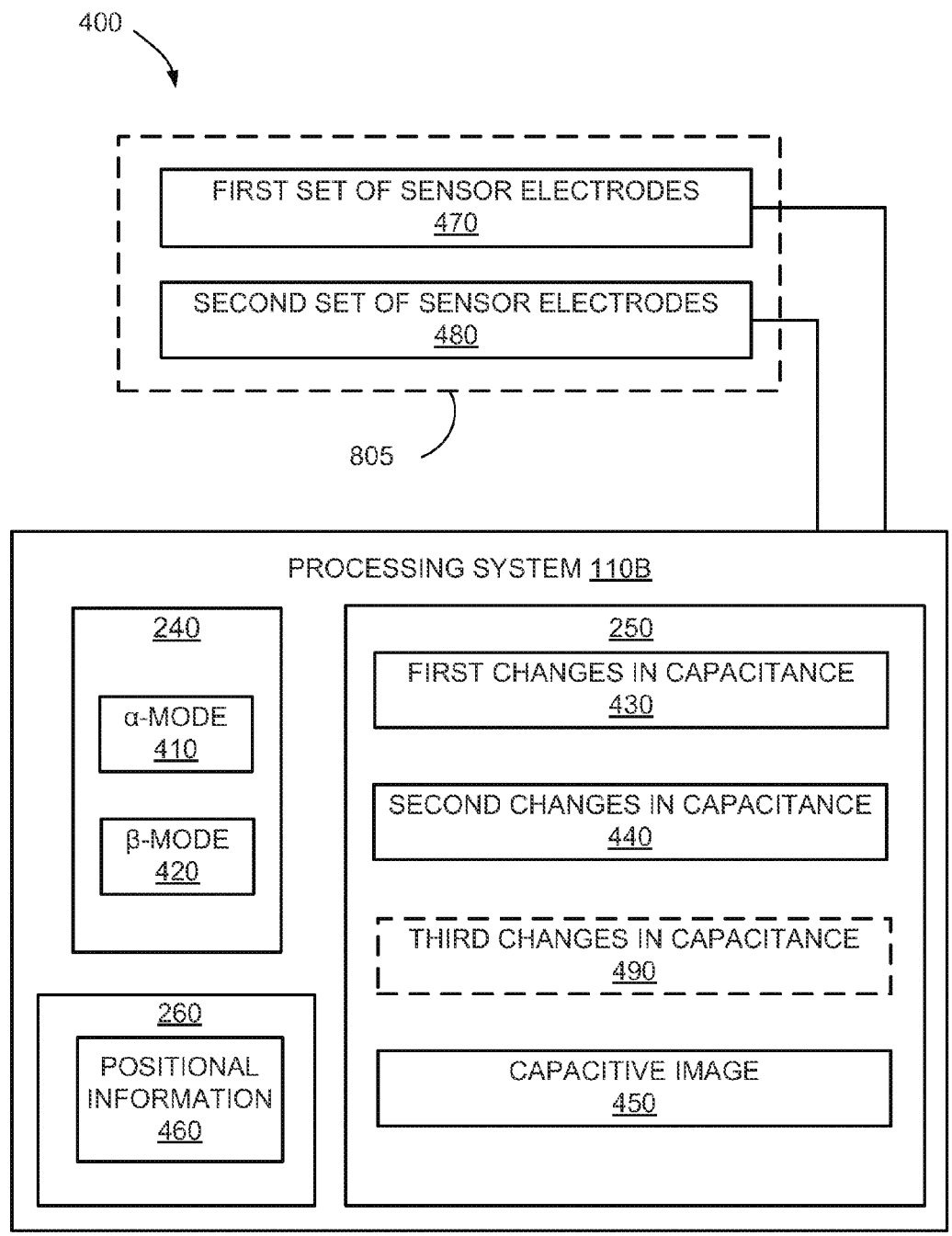
FIG. 4 is a block diagram depicting a capacitive sensor device according to an example implementation.

FIG. 4 is a block diagram depicting a capacitive sensor device 400 according to an example implementation. The capacitive sensor device 400 includes sensor electrodes 405 coupled to an example implementation of the processing system 110 ("the processing system 110B"). Elements of the processing system 110E that are the same or similar to those of the processing system 110, are designated with identical reference numerals. The sensor electrodes 405 include a first set of sensor electrodes 470 and a second set of sensor electrodes 480. In an example, the first set of sensor electrodes 470 can be disposed along a first axis, and the second set of sensor electrodes 480 can be disposed along a second axis. In an example, the first axis is orthogonal to the second axis such that the sensor electrodes 470 are orthogonal to the sensor electrodes 480.

The sensor module 240 includes module 410 for driving the sensor electrodes 405 in the α-mode, and a module 420 for driving the sensor electrodes 405 in the β-mode. In the α-mode, the module 410 drives the sensor electrodes 405 with a capacitive sensing signal to obtain indicia of capacitance (α-measurements). For example, the module 410 can drive each of the sensor electrodes 405 with a potential $V_K$ and measure changes in induced charge on each of the sensor electrodes 405. That is, for each sensor electrode k in the sensor electrodes 405, the module 410 can measure $\Delta Q\_k\hat{}(\alpha(\alpha))$. In one example, the module 410 can drive all the sensor electrodes 405 concurrently. The capacitive measurer module 250 acquires first changes in capacitance 430 based on the indicia of capacitance determined by the module 410. The first changes in capacitance 430 represent changes in capacitive couplings between each of the sensor electrodes 405 and an input object, which can include a set of objects. The first changes in capacitance 430 also provide profile information. The profile information can include a first capacitive profile along a first axis (e.g., the axis of the first set of the sensor electrodes 470), and a second capacitive profile along a second axis (e.g., the axis of the second set of the sensor electrodes 480).

In another example, rather than driving all sensor electrodes concurrently, the module 410 can implement the α-mode in a plurality of phases, such as a first phase and a second phase. In the first phase, the module 410 drives a first portion of the sensor electrodes 405 with the capacitive sensing signal and a second portion of the sensor electrodes 405 with a guard signal. In the second phase, the module 410 drives the second portion of the sensor electrodes 405 with the capacitive sensing signal, and the first portion with the guard signal. The guard signal can be signal having the same potential as the capacitive sensing signal, but is not used to sense indicia of capacitance. After the two phases, the capacitive measurer module 250 can acquire the first changes in capacitance 430.

In the β-mode, the module 420 drives at least one sensor electrode in the first set of sensor electrodes 470 with a reference signal, and at least one sensor electrode in the second set of sensor electrodes 480 with a capacitive sensing signal to obtain indicia of capacitance (β-measurements). For example, the module 420 can obtain measurements $\Delta Q\_k\hat{}(\alpha(\beta))$ for sensor electrode(s) in the second set 480. The reference signal can be a substantially constant voltage signal, such as system ground or any offset from system ground. The sensor electrode(s) that are driven with the reference signal represent the specially selected electrodes in the subset P discussed above. In one example, the module 420 can select each electrode in the first set of electrodes 470 to be driven with the reference signal. In another example, the module 420 can select a subset of electrodes from the first set 470. The selection of electrodes on which to drive the reference signal in the β-mode can be determined using profile information from the α-mode (e.g., profile information derived from the first changes in capacitance 430). For example, the module 420 can identify local maxima in the capacitive profile along the axis of the first set 470 and select electrode(s) corresponding to the local maxima to drive with the reference signal.

For each electrode in the first set 470 selected to be driven with the reference signal, the module 420 can drive some or all of the electrodes in the second set 480 with the capacitive sensing signal in sequence (e.g., the electrodes in the second set 480 can be scanned). The selection of electrodes in the second set 480 on which to scan can be determined using profile information from the α-mode. For example, the module 420 can identify local maxima in the capacitive profile along the axis of the second set 480 and select electrode(s) corresponding to the local maxima to drive with the capacitive sensing signal in sequence. That is, the module 420 can select an electrode in the first set 470, drive the selected electrode with a reference signal, scan through some or all of the electrodes in the second set 480 to obtain changes in induced charge, select another electrode in the first set 470, and repeat the process. In some examples, the module 420 can select more than one electrode in the first set 470 to be driven with the reference signal at the same time. That is, the module 420 can select a plurality of electrodes in the first set 470, drive the selected electrodes with a reference signal, scan through some or all of the electrodes in the second set 480 to obtain changes in induced charge, select another plurality of electrodes in the first set 470, and repeat the process.

The capacitive measurer module 250 acquires second changes in capacitance 440 based on the indicia of capacitance determined by the module 420. The second changes in capacitance 440 represent changes in capacitive couplings between some or all of the electrodes in the second set 480 and input object(s). The capacitive measurer module 250 determines capacitive image 450 based at least in part on the first and second changes of capacitance 430, 440. For example, the capacitive measurer module 250 can difference the first and second changes of capacitance 430, 440 to obtain the capacitive image, as shown above in Equation 2. In other examples, the capacitive measurer module 250 can perform other operations in addition to or in place of the difference between the first and second changes of capacitance 430, 440 to obtain the capacitive image. The determiner 260 can process the capacitive image 450 to obtain positional information 460.

The first and second sets of sensor electrodes 470 and 480 are independent of physical disposition and orientation within the sensor electrodes 805. For example, as discussed below, a first plurality of sensor electrodes can be disposed along an x-axis, and a second plurality of sensor electrodes can be disposed along a y-axis. In some sensors, one plurality of electrodes may be referred to as "transmitter electrodes" and another plurality may be referred to as "receiver electrodes." The terms "transmitter" and "receiver" however, are merely labels when absolute capacitance sensing is employed. The module 420 can select one plurality of the sensor electrodes to be the first set 470 (e.g., transmitters), and the other plurality of the sensor electrodes to be the second set 480 (e.g., receivers). In an example, the module 420 can apportion the sensor electrodes into the sets 470, 480 based on numbers of local maxima in capacitive profiles along both axes (obtained from the first changes in capacitance 430). The module 420 can select the plurality of sensor electrodes having the lower number of local maxima to be the second set 480. In this manner, the smaller number of electrodes will be in the special selected set P to be driven with the reference signal. The fewer electrodes in the set P, the faster the processing system 110B can determine the capacitive image 450.

In one example, after the module 420 performs the β-mode as described above, the module 420 can swap the first and second sets of sensor electrodes 470, 480 and repeat the process. That is, the module 420 drives at least one sensor electrode in the second set 480 with a reference signal and at least one sensor electrode in the first set 470 with a capacitive sensing signal. The capacitive measurer module 250 acquires third changes in capacitance 490 based on the indicia of capacitance from the module 420 after swapping sensor electrode sets. The capacitive measurer module 250 then determines the capacitive image 450 based at least in part on the first changes in capacitance 430, and an average of the second and third changes in capacitance 440, 490. While in theory the module 420 produces the same results after swapping the first and second sets 470, 480, there can be small differences in the subtraction accuracies and/or noise sources that cause different results. Averaging can be employed to smooth the results of the β-mode.

Figure 5:
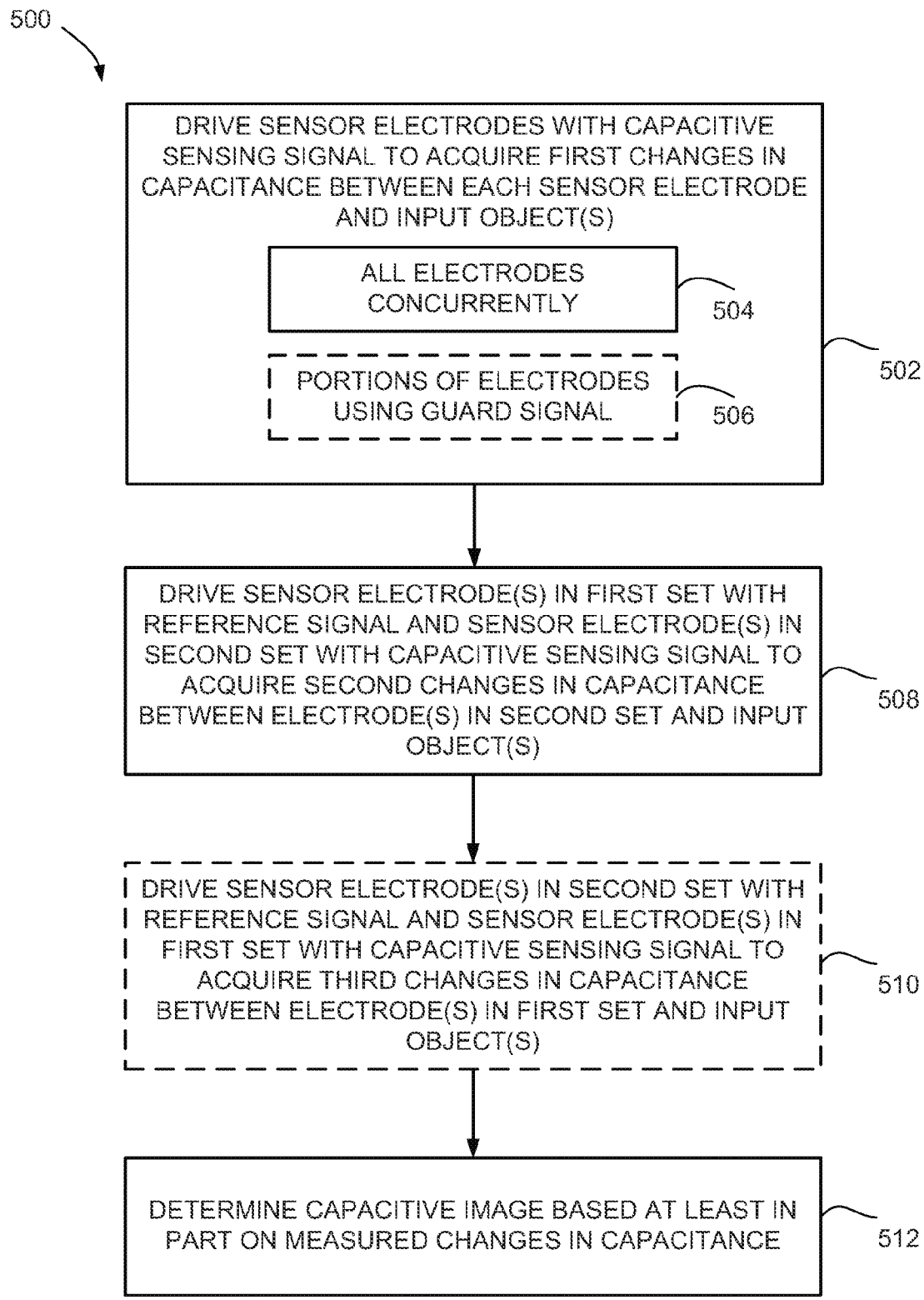
FIGS. 5-7 show flow diagrams depicting methods of driving sensor electrodes for capacitive sensing in example implementations.
Figure 6:
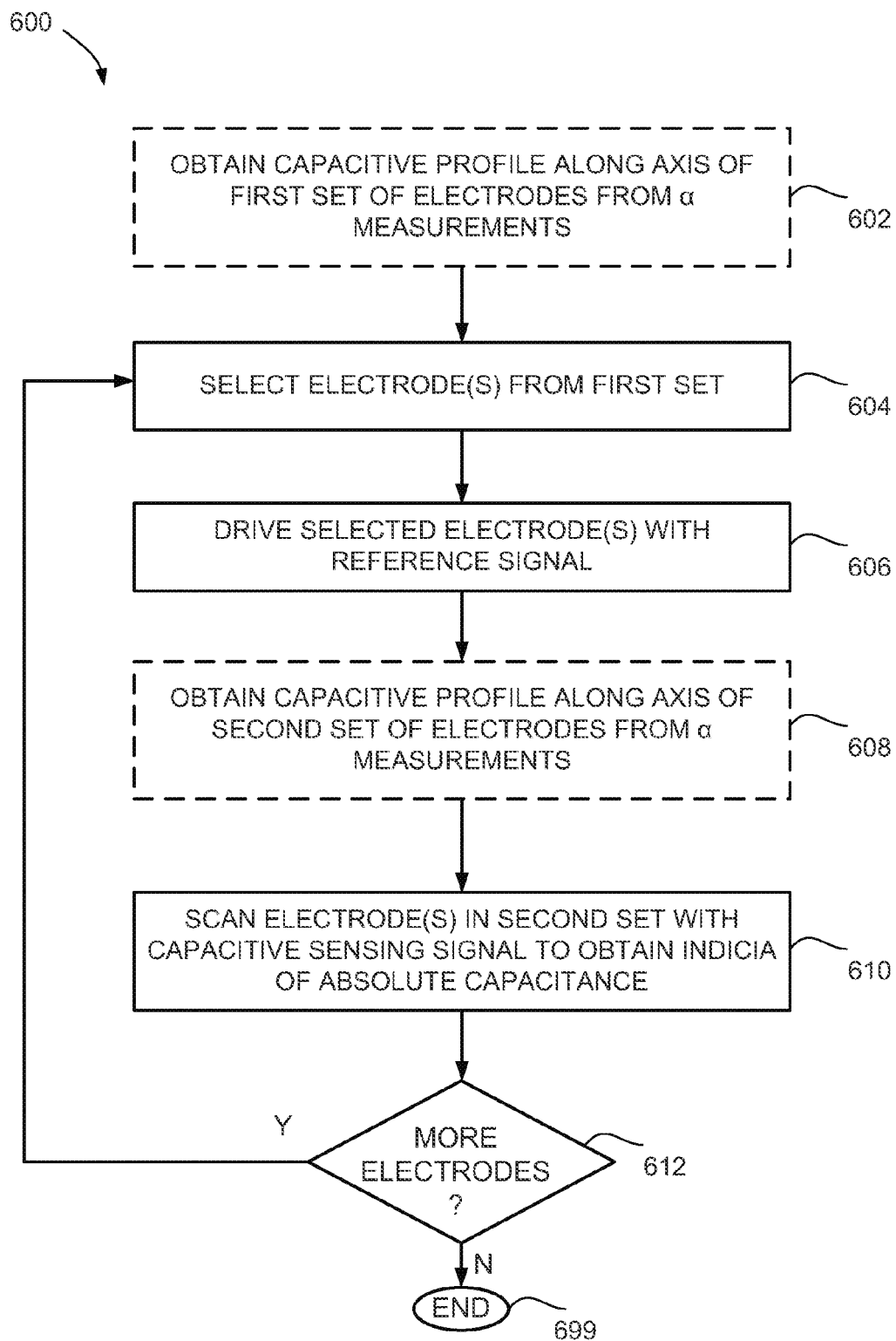
Figure 7:
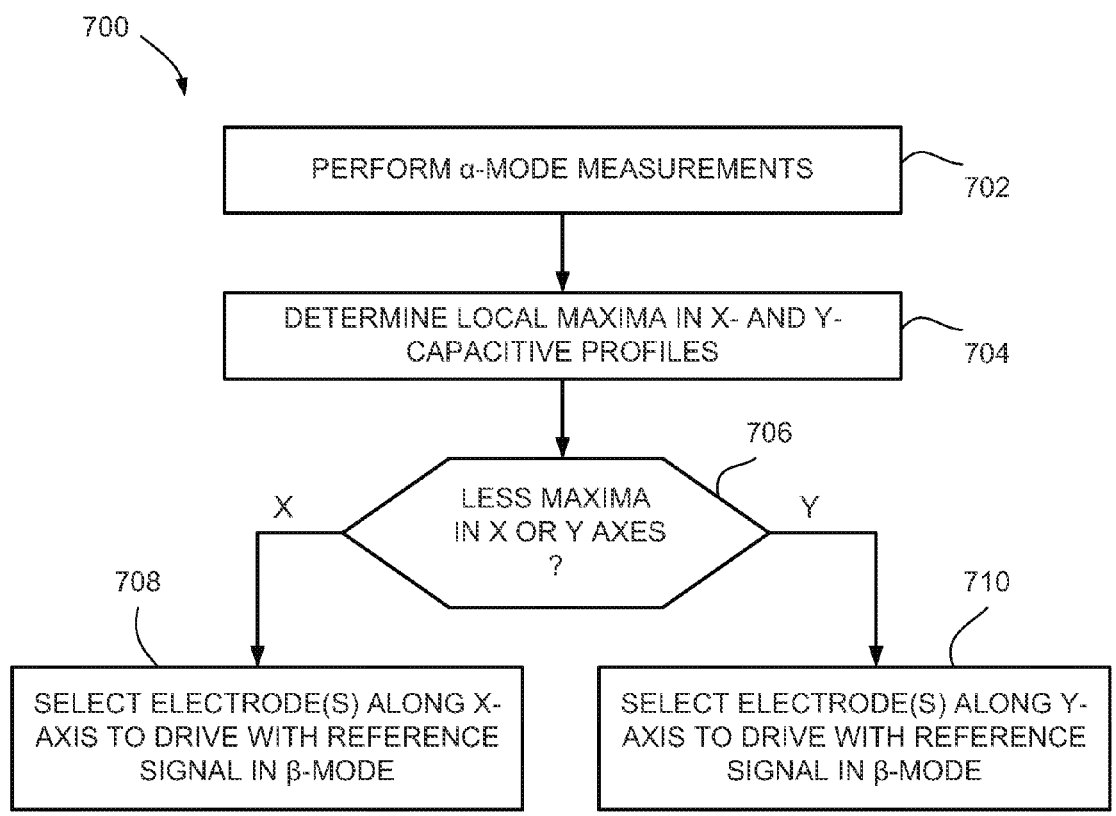
Figure 8:
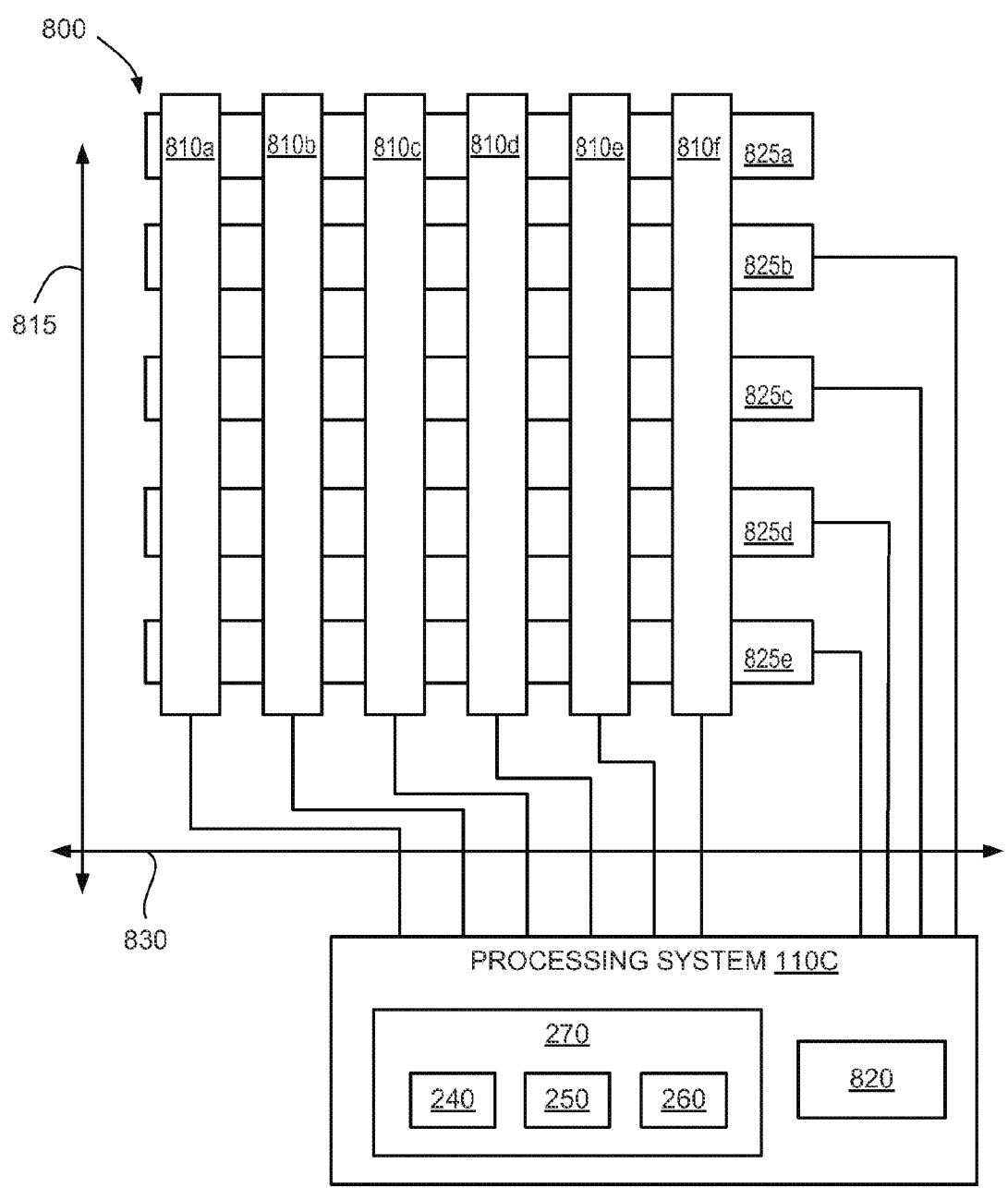
FIG. 8 depicts a block diagram of a capacitive sensing device according to an example implementation.
Figure 9:
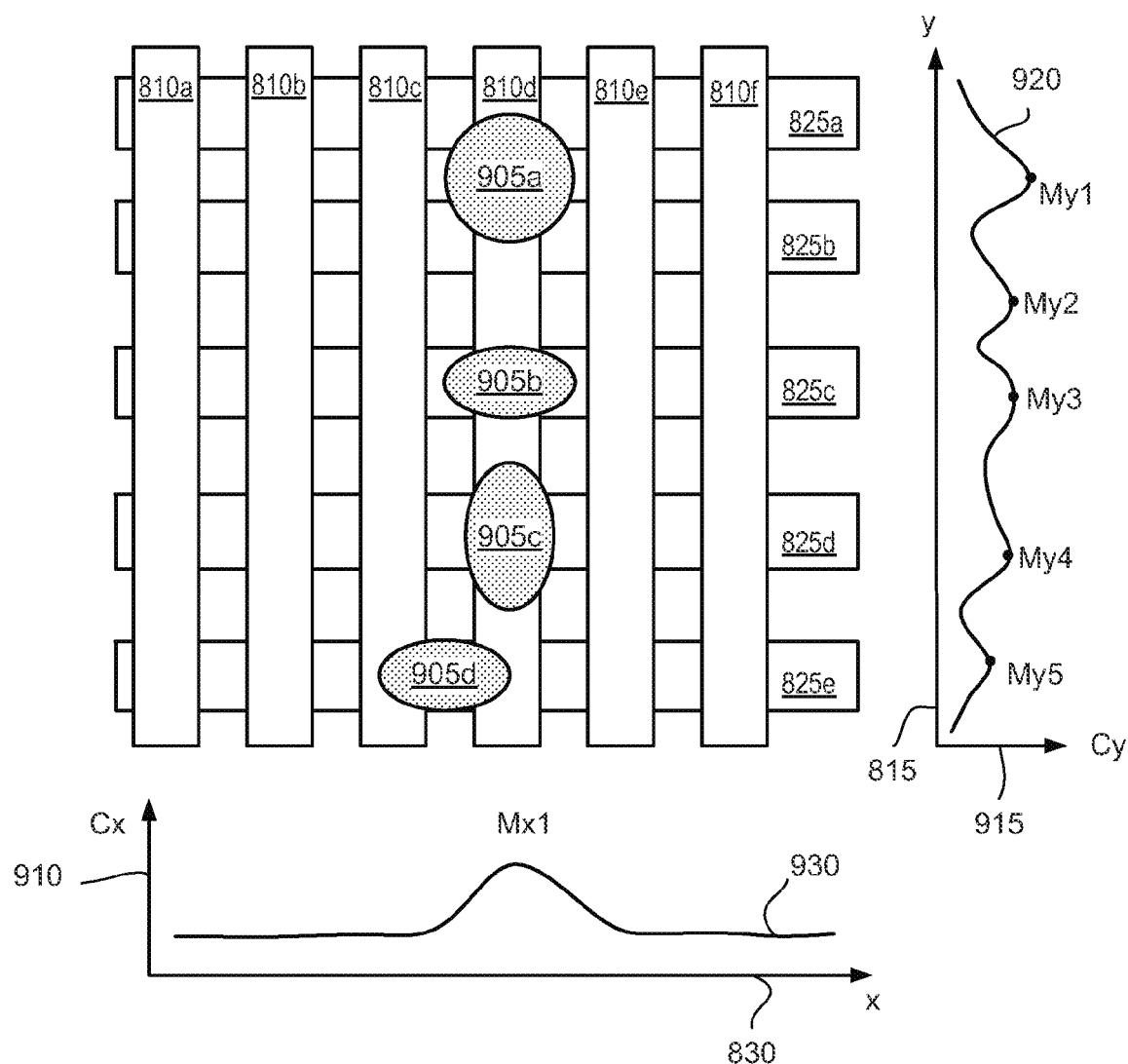
FIG. 9 shows the sensor electrodes with respect to example input according to an example implementation.

FIGS. 5-7 depict flow diagrams showing methods of driving sensor electrodes for capacitive sensing according to example implementations. FIGS. 8 and 9 show an example capacitive sensing device along with an example input. Aspects of the methods in FIGS. 5-7 can be understood with references to the examples of FIGS. 8 and 9 by way of example and not limitation.

FIG. 8 depicts a block diagram of a capacitive sensing device 800 according to an example implementation. The capacitive sensing device 800 includes sensor electrodes 810a through 810f (collectively "sensor electrodes 810") aligned along a first axis 830, and sensor electrodes 825a through 825e (collectively "sensor electrodes 825") along a second axis 815 that is not parallel to the first axis 830. In an example, the first axis 830 is orthogonal to the second axis 815. For convenience of description, the first axis 830 may be referred to as the "x-axis", and the second axis 815 may be referred to as the "y-axis". The sensor electrodes 810, 825 are coupled to an example implementation of the processing system 110 ("processing system 110C"). For purposes of clarity by example, all of the sensor electrodes 810, 825 are illustrated as being of similar size. In other examples, the sensor electrodes 825 may be of substantially greater surface area than the sensor electrodes 810, or the sensor electrodes 810 may be of substantially greater surface area than then sensor electrodes 825.

The processing system 110C includes similar features that have been previously described for the processing systems 110, 110A, and 110B, including the circuitry 270, the sensor module 240, the capacitive measurer module 250, and the determiner 260. The processing system 110c can also include a mode selection module 820. The mode selection module 820 determines whether the processing system 110c operates in an absolute capacitance sensing mode or a transcapacitance sensing mode. In the absolute capacitance sensing mode, the circuitry 270 operates as described above (e.g., employing the α- and β-modes to determine a capacitive image). In the transcapacitance sensing mode, the circuitry 270 operates in a manner to obtain a capacitive image using transcapacitance. Hence, the sensor electrodes 810, 825 can be configured in a transmitter/receiver scheme. For example, the electrodes 810 can be receiver electrodes and the electrodes 825 can be transmitter electrodes. In the absolute capacitance sensing mode, the transmitter and receiver electrodes are simply two pluralities of electrodes. For ease of description, the sensor electrodes 810 may be referred to as receiver electrodes, and the sensor electrodes 825 may be referred to as transmitter electrodes even in the absolute capacitance sensing mode. The mode selection module 820 is optional, and in other examples the processing system 110c only operates in the absolute capacitance sensing mode. Further, in some examples, the functions described as being performed by the mode selection module 820 can be performed instead by one or more other modules described above.

FIG. 5 is a flow diagram depicting a method 500 of driving sensor electrodes for capacitive sensing in an example implementation. The method 500 begins at step 502, where sensor electrodes are driven with a capacitive sensing signal to acquire first changes in capacitance between each of the sensor electrodes and input object(s). For example, the sensor module 240 can employ the α-mode to drive the sensor electrodes 810, 825 with a capacitive sensing signal to acquire α-measurements and the first changes in capacitance. In one example, at step 504, the sensor electrodes are driven concurrently with the capacitive sensing signal. In another example, step 504 is omitted and at optional step 506, portions of the sensor electrodes are driven with the capacitive sensing signal in sequence while respective remaining portions are driven with a guard signal. The first changes in capacitance can include capacitive profile information. The capacitive profile information can include a capacitive profile along the x-axis 830, and a capacitive profile along the y-axis 815.

For example, FIG. 9 shows the sensor electrodes 810, 825 with respect to example input according to an example implementation. The example input includes input objects 905a through 905d (collectively "input objects 905"). Performing the α-mode in the presence of the input objects 905 can yield a capacitive profile 930 along the x-axis 830 and a capacitive profile 920 along the y-axis 815. An axis 910 denotes the magnitude of capacitance for the capacitive profile 930 (denoted "Cx"), and an axis 915 denotes the magnitude of capacitance for the capacitive profile 920 (denoted "Cy"). The capacitive profiles can include any number of local minima and maxima along their respective axes. For example, the capacitive profile 930 includes a single local maxima denoted Mx1. The capacitive profile 920 includes five local maxima denoted My1 through My5.

Returning to FIG. 5, at step 508, sensor electrode(s) in a first set are driven with a reference signal while sensor electrode(s) in a second set are driven with a capacitive sensing signal to acquire second changes in capacitance between the sensor electrode(s) in the second set and the input object(s). For example, the sensor module 240 can employ the β-mode to drive some of the sensor electrodes 810, 825 with a capacitive sensing signal and some of the sensor electrodes 810, 825 with a reference signal to acquire β-measurements and the second changes in capacitance.

In the example of FIG. 9, the sensor electrodes 810 can be selected as the first set of electrodes, and the sensor electrodes 825 can be selected as the second set of electrodes. As discussed below, the sensor electrodes 810, 825 can be apportioned between the first and second sets based on the capacitive profile information. The sensor module 240 can drive one or more of the sensor electrodes 810 with a reference signal while driving some or all of the sensor electrodes 825 with a capacitive sensing signal in sequence (e.g., scanning) to obtain β-measurements. The sensor module 240 can repeat the process by driving additional electrode(s) 810 with a reference signal while scanning some or all of the sensor electrodes 825 to obtain additional measurements. For example, the sensor module 240 can drive the sensor electrode 810d with a reference signal and scan the sensor electrodes 825a through 825e to obtain five β-measurements. The sensor module 240 can drive neighboring sensor electrodes 810c and 810e with a reference signal while scanning the sensor electrodes 825a through 825e to obtain two more sets of five β-measurements.

Returning to FIG. 5, at step 512, a capacitive image is determined based at least in part on the first and second changes of capacitance. The capacitive image can be determined by taking the difference between the first changes in capacitance and the second changes in capacitance. For example, the capacitive measurer module 250 can determine a series of differences of β-measurements from α-measurements to yield the capacitive image.

In one example, at optional step 510, the sensor electrode(s) in the second set are driven with a reference signal while sensor electrode(s) in the first set are driven with a capacitive sensing signal to acquire third changes in capacitance between the sensor electrode(s) in the first set and the input object(s). At step 512, the capacitive image can be determined at least in part on the first changes in capacitance and a combination of the second and third changes in capacitance, such as an average of the second and third changes. For example, the capacitive measurer module 250 can average β-measurements from step 508 with β-measurements from step 510 to obtain average β-measurements. The capacitive measurer module 250 can then determine a series of differences of the average β-measurements from α-measurements to yield the capacitive image.

FIG. 6 is a flow diagram depicting a method 600 of driving sensor electrodes for capacitive sensing according to an example implementation. The method 600 may be used during the step 508 or the step 510 of the method 500 to obtain the second changes in capacitance (e.g., β-measurements). The method 600 begins at step 604, where sensor electrode(s) are selected from the first set. In an example, at optional step 602, a capacitive profile is obtained along the axis of the first set of electrodes. The sensor electrode(s) are then selected in step 604 based on the capacitive profile.

For example, as shown in FIG. 9, the electrodes 810 can be the first set of electrodes. The capacitive profile 930 contains a local maximum near the sensor electrodes 810d. The sensor module 240 can select at least the sensor electrode 810d at step 604.

At step 606, the selected electrode(s) are driven with a reference signal. At step 610, electrode(s) in the second set are scanned with a capacitive sensing signal to obtain indicia of absolute capacitance (e.g., β-measurements). In an example, at optional step 608, a capacitive profile is obtained along the axis of the second set of electrodes. The sensor electrode(s) to be scanned are then selected in step 610 based on the capacitive profile.

For example, as shown in FIG. 9, the electrodes 825 can be the second set of electrodes. The capacitive profile 920 contains five local maxima along the five electrodes 825a through 825e. The sensor module 240 can select the sensor electrodes 825a through 825e to be scanned in step 610 based on the capacitive profile 920.

At step 612, a determination is made whether there are additional electrode(s) to be selected from the first set to be driven with a reference signal. If so, the method 600 returns to step 604 and repeats. Otherwise, the method 600 ends at step 699. For example, as shown in FIG. 9, the sensor module 240 can select a neighboring sensor electrode, e.g., the sensor electrode 810c, and repeat the process to obtain additional indicia of absolute capacitance. The sensor module 240 can then select another neighboring sensor electrode (e.g., the sensor electrode 810e) and obtain still additional indicia of absolute capacitance.

FIG. 7 is a flow diagram depicting a method 700 of driving sensor electrodes for capacitive sensing according to an example implementation. The method 700 begins at step 702, where α-measurements are obtained by driving sensor electrodes in the α-mode. At step 704, local maxima are identified in the x- and y-capacitive profiles obtained from the α-measurements. At step 706, a determination is made whether there are less local maxima in the x-capacitive profile or the y-capacitive profile. If there are less local maxima in the x-capacitive profile, the method 700 proceeds to step 708. If there are less local maxima in the y-capacitive profile, the method 700 proceeds to step 710. At step 708, electrode(s) along the x-axis is/are driven with a reference signal, and electrode(s) along the y-axis are scanned, to obtain β-measurements. At step 710, electrode(s) along the y-axis is/are driven with a reference signal, and electrode(s) along the x-axis are scanned, to obtain β-measurements.

In the example of FIG. 9, the capacitive profile 930 along the x-axis contains less local maxima than the capacitive profile 920 along the y-axis. The sensor module 240 can select some or all of the electrodes 825 to scan while driving at least one of the electrode(s) 810 (e.g., the sensor electrode 810d) with a reference signal to obtain β-measurements.

Thus, the embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. A processing system, comprising:
 a sensor module comprising sensor circuitry, the sensor module configured to:
  drive sensor electrodes with a capacitive sensing signal to measure first changes of capacitance between each of the sensor electrodes and at least one input object; and
  drive at least one sensor electrode in a first set of the sensor electrodes with a reference signal and at least one sensor electrode in a second set of the sensor electrodes with a capacitive sensing signal to measure second changes of capacitance between the at least one sensor electrode in the second set and the at least one input object; and
 a capacitive measurer module configured to determine a capacitive image based at least in part on the first and second changes of capacitance.

2. The processing system of claim 1, wherein the first set of the sensor electrodes is disposed orthogonal to the second set of the sensor electrodes.

3. The processing system of claim 1, wherein the sensor module is configured to drive the at least one sensor electrode in the first set of the sensor electrodes with a reference signal and the at least one sensor electrode in the second set of the sensor electrodes with a capacitive sensing signal to measure the second changes of capacitance by:
 driving a first sensor electrode in the first set with a reference signal while driving the at least one sensor electrode in the second set with a capacitive sensing signal; and
 driving a second sensor electrode in the first set with a reference signal while driving the at least one sensor electrode in the second set with a capacitive sensing signal.

4. The processing system of claim 1, wherein the capacitive measurer module is configured to determine the capacitive image by differencing the first changes of capacitance and the second changes of capacitance.

5. The processing system of claim 1, wherein the sensor module is configured to drive the sensor electrodes with a capacitive sensing signal to measure the first changes of capacitance by driving the sensor electrodes concurrently with a capacitive sensing signal.

6. The processing system of claim 1, wherein the sensor module is configured to drive the sensor electrodes with a capacitive sensing signal to measure the first changes of capacitance by:
 driving the first set of the sensor electrodes with a capacitive sensing signal while driving the second set of the sensor electrodes with a guard signal during a first time period; and
 driving the first set of the sensor electrodes with a guard signal while driving the second set of the sensor electrodes with a capacitive sensing signal during a second time period.

7. The processing system of claim 1, wherein the sensor module is configured to drive the at least one sensor electrode in the first set of the sensor electrodes with a reference signal and the at least one sensor electrode in the second set of the sensor electrodes with a capacitive sensing signal to measure the second changes of capacitance by:
 obtaining a first capacitive profile along an axis defined by a first plurality of the sensor electrodes and a second capacitive profile along an axis defined by a second plurality of sensor electrodes; and
 selecting the first set of the sensor electrodes as either the first plurality of the sensor electrodes or the second plurality of the sensor electrodes based on numbers of local maxima in the first and second capacitive profiles.

8. The processing system of claim 1, wherein the sensor module is configured to drive the at least one sensor electrode in the first set of the sensor electrodes with a reference signal and the at least one sensor electrode in the second set of the sensor electrodes with a capacitive sensing signal to measure the second changes of capacitance by:

obtaining a capacitive profile along an axis defined by the first set of sensor electrodes; and selecting the at least one electrode in the first set to be driven with a reference signal based on the capacitive profile.

9. The processing system of claim 1, wherein the sensor module is configured to drive the at least one sensor electrode in the first set of the sensor electrodes with a reference signal and the at least one sensor electrode in the second set of the sensor electrodes with a capacitive sensing signal to measure the second changes of capacitance by:

driving a plurality of sensor electrodes in the first set with a reference signal while driving at least one sensor electrode in the second set with a capacitive sensing signal.

10. The processing system of claim 1, wherein the sensor module is configured to:

drive at least one sensor electrode in the second set of the sensor electrodes with a reference signal and at least one sensor electrode in the first set of the sensor electrodes with a capacitive sensing signal to measure third changes of capacitance between the at least one sensor electrode in the first set and the at least one input object; and wherein the capacitive measurer module is configured to determine the capacitive image based at least in part on the first changes of capacitance and an average of the second changes of capacitance and the third changes of capacitance.

11. A method of driving sensor electrodes for capacitive sensing, comprising:

driving the sensor electrodes with a capacitive sensing signal to measure first changes of capacitance between each of the sensor electrodes and at least one input object;

driving at least one sensor electrode in a first set of the sensor electrodes with a reference signal and at least one sensor electrode in a second set of the sensor electrodes with a capacitive sensing signal to measure second changes of capacitance between the at least one sensor electrode in the second set and the at least one input object; and determining a capacitive image based at least in part on the first and second changes of capacitance.

12. The method of claim 11, wherein the step of determining the capacitive image comprises:

differencing the first changes of capacitance and the second changes of capacitance.

13. The method of claim 11, wherein the step of driving the sensor electrodes with a capacitive sensing signal to measure the first changes of capacitance comprises:

driving the sensor electrodes concurrently with a capacitive sensing signal.

14. The method of claim 11, wherein the step of driving the sensor electrodes with a capacitive sensing signal to measure the first changes of capacitance comprises:

driving the first set of the sensor electrodes with a capacitive sensing signal while driving the second set of the sensor electrodes with a guard signal during a first time period; and driving the first set of the sensor electrodes with a guard signal while driving the second set of the sensor electrodes with a capacitive sensing signal during a second time period.

15. The method of claim 11, wherein the step of driving the at least one sensor electrode in the first set of the sensor electrodes with a reference signal and the at least one sensor electrode in the second set of the sensor electrodes with a capacitive sensing signal to measure the second changes of capacitance comprises:

obtaining a first capacitive profile along an axis defined by a first plurality of the sensor electrodes and a second capacitive profile along an axis defined by a second plurality of sensor electrodes; and selecting the first set of the sensor electrodes as either the first plurality of the sensor electrodes or the second plurality of the sensor electrodes based on numbers of local maxima in the first and second capacitive profiles.

16. The method of claim 11, wherein the step of driving the at least one sensor electrode in the first set of the sensor electrodes with a reference signal and the at least one sensor electrode in the second set of the sensor electrodes with a capacitive sensing signal to measure the second changes of capacitance comprises:

obtaining a capacitive profile along an axis defined by the first set of the sensor electrodes; and selecting the at least one electrode in the first set to be driven with a reference signal based on the capacitive profile.

17. The method of claim 11, wherein the step of driving the at least one sensor electrode in the first set of the sensor electrodes with a reference signal and the at least one sensor electrode in the second set of the sensor electrodes with a capacitive sensing signal to measure the second changes of capacitance comprises:

driving a plurality of sensor electrodes in the first set with a reference signal while driving at least one sensor electrode in the second set with a capacitive sensing signal.

18. The method of claim 11, further comprising:

driving at least one sensor electrode in the second set of the sensor electrodes with a reference signal and at least one sensor electrode in the first set of the sensor electrodes with a capacitive sensing signal to measure third changes of capacitance between the at least one sensor electrode in the first set and the at least one input object;

determining the capacitive image based at least in part on the first changes of capacitance and an average of the second changes of capacitance and the third changes of capacitance.

19. An input device, comprising:

sensor electrodes; and a processing system coupled to the sensor electrodes, the processing system configured to:

drive the sensor electrodes with a capacitive sensing signal to measure first changes of capacitance between each of the sensor electrodes and at least one input object;

drive at least one sensor electrode in a first set of the sensor electrodes with a reference signal and at least one sensor electrode in a second set of the sensor electrodes with a capacitive sensing signal to measure second changes of capacitance between the at least one sensor electrode in the second set and the at least one input object; and determine a capacitive image based at least in part on the first and second changes of capacitance.

20. The input device of claim 19, wherein the first set of the sensor electrodes is disposed orthogonal to the second set of the sensor electrodes.

* * * * *